United States Patent
Nakagawa et al.

(10) Patent No.: US 8,018,012 B2
(45) Date of Patent: Sep. 13, 2011

(54) SOLID-STATE IMAGE SENSOR AND MANUFACTURING METHOD THEREOF

(75) Inventors: Atsuo Nakagawa, Kyoto (JP); Ichiroh Murakami, Kyoto (JP); Masanori Murakami, legal representative, Shizuoka (JP)

(73) Assignee: Panasonic Corporation, Osaka (JP)

( * ) Notice: Subject to any disclaimer, the term of this patent is extended or adjusted under 35 U.S.C. 154(b) by 205 days.

(21) Appl. No.: 12/428,261

(22) Filed: Apr. 22, 2009

(65) Prior Publication Data

US 2009/0302408 A1 Dec. 10, 2009

(30) Foreign Application Priority Data

Jun. 9, 2008 (JP) ................. 2008-150616

(51) Int. Cl.
*H01L 31/232* (2006.01)
(52) U.S. Cl. ........ 257/432; 257/431; 257/435; 257/436; 257/437; 257/E31.127
(58) Field of Classification Search .......... 257/431–432, 257/435–437, 225, E31.127
See application file for complete search history.

(56) References Cited

U.S. PATENT DOCUMENTS

| 5,929,470 | A | 7/1999 | Harada et al. | |
|---|---|---|---|---|
| 6,060,732 | A | 5/2000 | Murakami et al. | |
| 6,379,993 | B1 * | 4/2002 | Nakano et al. | 438/75 |
| 6,468,826 | B1 | 10/2002 | Murakami et al. | |
| 7,541,631 | B2 * | 6/2009 | Yamada et al. | 257/294 |
| 2007/0057286 | A1 | 3/2007 | Sato | |

FOREIGN PATENT DOCUMENTS

| JP | 04-206571 | 7/1992 |
|---|---|---|
| JP | 06-209100 | 7/1994 |
| JP | 2000-012817 | 1/2000 |

* cited by examiner

*Primary Examiner* — Cuong Q Nguyen
*Assistant Examiner* — Trang Q Tran
(74) *Attorney, Agent, or Firm* — McDermott Will & Emery LLP (57) ABSTRACT

A solid-state image sensor includes: a photoelectric conversion region formed in an upper part of a semiconductor substrate, for generating charges by photoelectric conversion; a transfer region formed in the upper part of the semiconductor substrate and located on a side of the photoelectric conversion region, for transferring the charges; and a transfer electrode formed over the semiconductor substrate and located above the transfer region. The solid-state image sensor further includes: a first insulating film which covers the photoelectric conversion region and the transfer electrode; an antireflection film which covers the first insulating film; and a first light-shielding film which is formed on the antireflection film and covers at least the transfer electrode. The antireflection film and the first light-shielding film have an opening above the transfer electrode.

18 Claims, 11 Drawing Sheets

SOLID-STATE IMAGE SENSOR AND MANUFACTURING METHOD THEREOF

CROSS-REFERENCE TO RELATED APPLICATIONS

This application claims priority under 35 U.S.C. §119(a) based on Japanese Patent Application No. 2008-150616 filed on Jun. 9, 2008, the entire contents of which are hereby incorporated by reference.

BACKGROUND

In CCD (Charge-Coupled Device) solid-state image sensors, signal charges are generated in an n-type semiconductor region formed at the surface of a p-type silicon substrate, when light is incident on the n-type semiconductor region. A video signal can be obtained based on the signal charges generated in each pixel.

Figure 16:
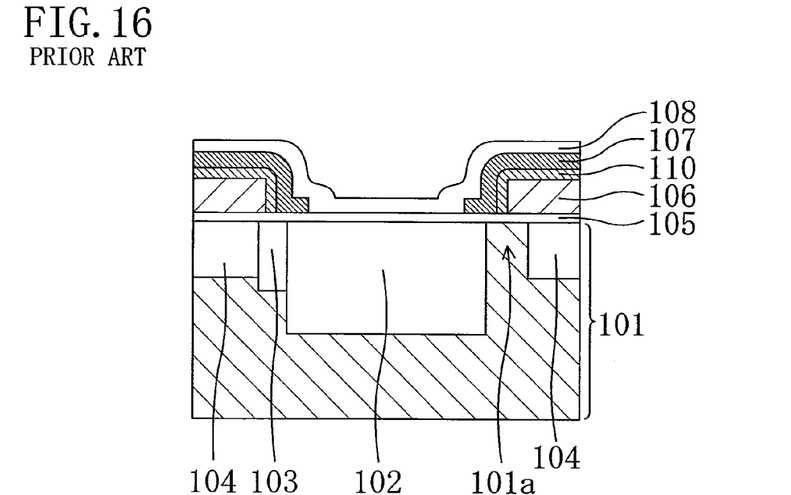
FIG. 16 shows a cross-sectional structure of a main part of a solid-state image sensor according to a first related technique.

FIG. 16 is a cross-sectional view showing an example of solid-state image sensors as technical background. FIG. 16 shows a region including one of pixels arranged on a p-type silicon substrate 101. In FIG. 16, transfer electrodes 106 are formed on the p-type silicon substrate 101 with an insulating film 105 interposed therebetween. The insulating film 105 is a silicon oxide film. A photoelectric conversion region 102, which is an n-type semiconductor region, is formed in a surface part of the p-type silicon substrate 101 between adjacent two transfer electrodes 106. A light-shielding film 107, which is made of aluminum or tungsten, covers the transfer electrodes 106 with another insulating film 110 interposed therebetween. The light-shielding film 107 has an opening above the photoelectric conversion region 102. A passivation film 108 is formed so as to cover the insulating film 105 located on the photoelectric conversion region 102, and the light-shielding film 107.

Transfer regions 104, which are n-type semiconductor regions, are formed in an upper part of the p-type silicon substrate 101 under the transfer electrodes 106, respectively. Two transfer regions 104 are thus formed with the photoelectric conversion region 102 interposed therebetween. There is a gap between the photoelectric conversion region 102 and one of the transfer regions 104, and this gap serves as a transfer region 101a for transferring charges from the photoelectric conversion region 102 to the transfer region 104. A p$^+$-type semiconductor region 103 for isolating pixels from each other is formed between the photoelectric conversion region 102 and the other transfer region 104. This technique is hereinafter referred to as the first related technique.

The structure of the first related technique shown in FIG. 16, however, has large losses of incident light due to reflection at the surface of the p-type silicon substrate 101, and therefore does not have sufficient sensitivity. Regarding this problem, Japanese Published Patent Application No. H04-206571 (Document 1), for example, proposes to form an antireflection film over photoelectric conversion regions. Hereinafter, a technique represented by Document 1 is referred to as the second related technique.

Figure 17:
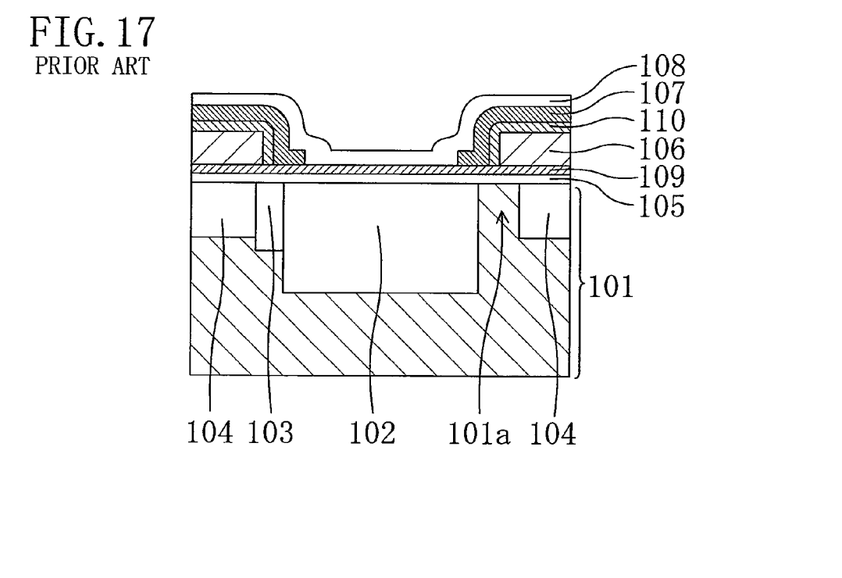
FIG. 17 shows a cross-sectional structure of a main part of a solid-state image sensor according to a second related technique.

The second related technique will now be described with reference to FIG. 17. Note that, in FIG. 17, components corresponding to those of FIG. 16 are denoted with the same reference numerals and characters as those of FIG. 16.

In the second related technique, a photoelectric conversion region 102 and transfer regions 104 are formed at the surface of, for example, a p-type silicon substrate 101. The photoelectric conversion region 102 is a region for obtaining signal charges, and the transfer regions 104 are regions for transferring the signal charges read from the photoelectric conversion region 102. The photoelectric conversion region 102 and the transfer regions 104 are n-type semiconductor regions, and are formed by, for example, impurity diffusion. Note that pixels are isolated from each other by a p$^+$-type semiconductor region 103.

An insulating film 105 is formed so as to cover the p-type silicon substrate 101, and an antireflection film 109 is formed on the insulating film 105. The insulating film 105 is a silicon oxide film, and the antireflection film 109 is a silicon nitride film having a refractive index higher than that of a silicon oxide film and lower than that of silicon. A silicon oxide film has a refractive index of about 1.45, a silicon nitride film has a refractive index of about 2.0, and silicon has a refractive index of about 4.1. Each of the insulating film 105 and the antireflection film 109 has a thickness of about 60 nm or less. Preferably, the respective thicknesses of the insulating film 105 and the antireflection film 109 are set to desirable values in the range of about 25 nm to about 50 nm.

By setting the respective thicknesses of the insulating film 105 and the antireflection film 109 to appropriate values in this manner, the reflectance can be suppressed to about 12% to about 13% on average in the visible wavelength region. This means that the reflectance is reduced to about one third of the reflectance in the case of a p-type silicon substrate (about 40%). This achieves high sensitivity.

This structure, however, has the following problem.

As described in, for example, Japanese Patent Laid-Open Publication No. H06-209100 (Document 2), one of effective methods for reducing a dark current in a solid-state image sensor is to diffuse hydrogen to a silicon interface (in the above example, the interface between the photoelectric conversion region 102 and the insulating film 105). When hydrogen terminates dangling bonds generated at the silicon interface, intermediate energy levels decrease, whereby a dark current is reduced. In the structure of the second related technique, however, dangling bonds cannot be sufficiently terminated by hydrogen in a final sintering process.

The reason for this is as follows: if the antireflection film 109 is a silicon nitride film and a hydrogen sintering process is performed after formation of the antireflection film 109, the silicon nitride film (the antireflection film) prevents hydrogen from reaching the silicon interface. Note that Document 2 does not disclose a method for reducing a dark current in a solid-state image sensor having an antireflection film.

Regarding this problem, Japanese Patent Laid-Open Patent Publication No. 2000-12817 (Document 3), for example, proposes to ensure a hydrogen path to a silicon interface. More specifically, a part of an antireflection film is removed above each transfer electrode so that the antireflection film does not prevent hydrogen from reaching the silicon interface even if a hydrogen sintering process is performed after formation of the antireflection film.

Figure 18:
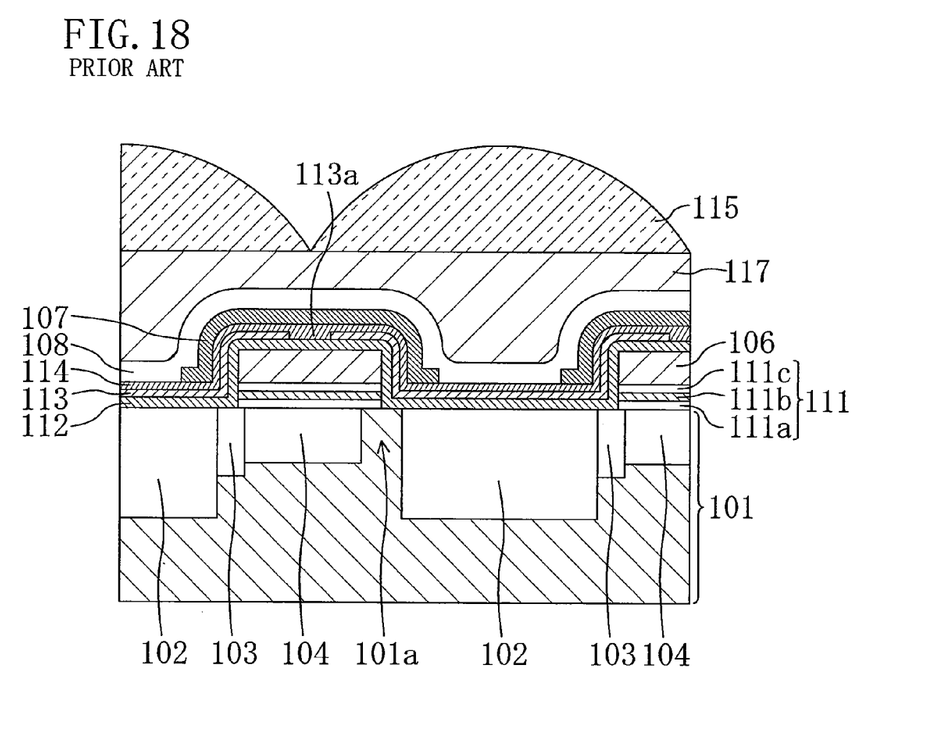
FIG. 18 shows a cross-sectional structure of a main part of a solid-state image sensor according to a third related technique.

Hereinafter, a technique represented by Document 3 is referred to as the third related technique and will be described with reference to FIG. 18. Note that, in FIG. 18, components corresponding to those of FIG. 17 are denoted with the same reference numerals and characters as those of FIG. 17.

In a solid-state image sensor of the third related technique, a plurality of photoelectric conversion regions 102 and a plurality of transfer regions 104 for transferring charges read from the respective photoelectric conversion regions 102 are formed in an upper part of a p-type silicon substrate 101. Transfer electrodes 106 are respectively formed above the transfer regions.

The transfer electrodes 106 are formed on the respective transfer regions 104 with an insulating film 111 interposed therebetween. The insulating film 111 has an ONO (Oxide Nitride Oxide) structure formed by a silicon oxide film 111a, a silicon nitride film 111b, and a silicon oxide film 111c.

A first insulating film 112, an antireflection film 113, and a second insulating film 114 are sequentially formed over the photoelectric conversion regions 102. More specifically, the first insulating film 112 is formed on the photoelectric conversion regions 102, the antireflection film 113 covers the first insulating film 112, and the second insulating film 114 covers the antireflection film 113. The first insulating film 112, the antireflection film 113, and the second insulating film 114 extend also over the transfer electrodes 106, and a light-shielding film 107 is formed so as to cover the second insulating film 114.

The third related technique is characterized in that the antireflection film 113 has an opening 113a above each transfer electrode 106. These openings 113a enable hydrogen to reach a silicon interface to terminate dangling bonds on the silicon surface even if a hydrogen sintering process is performed after formation of the antireflection film 113. Document 3 argues that a dark current can thus be reduced.

Note that a passivation film 108, a planarizing film 117, and lenses 115 are formed over the light-shielding film 107.

SUMMARY

When the hydrogen sintering process is performed in the structure of the third related technique, however, a sufficient amount of hydrogen cannot reach the silicon interface due to a long hydrogen path to the silicon interface.

Figure 19:
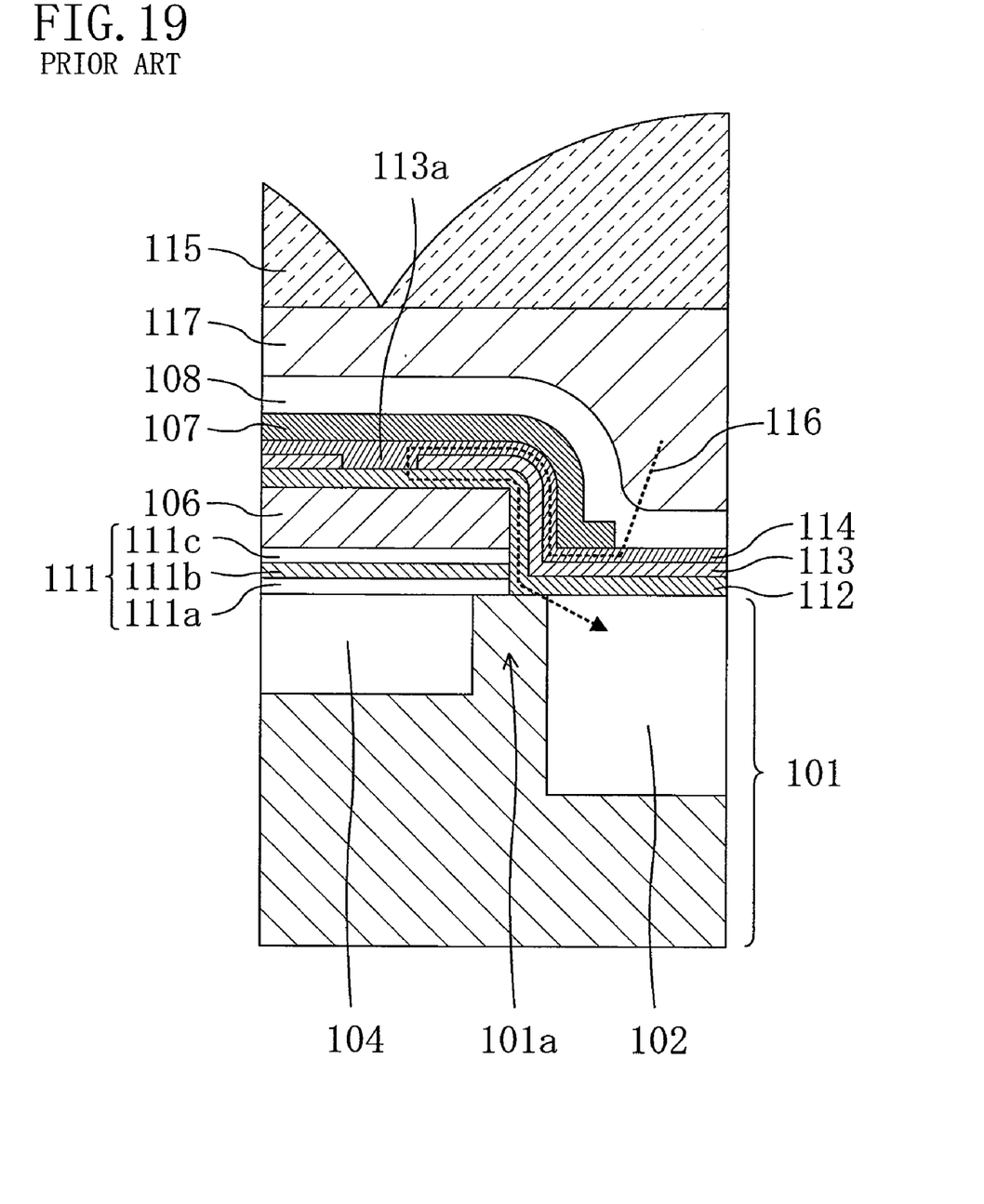
FIG. 19 is a diagram showing a hydrogen path to a photoelectric conversion region in a hydrogen sintering process in the solid-state image sensor of the third related technique.

This will be described with reference to FIG. 19. FIG. 19 is a partial enlarged view of the solid-state image sensor of the third related technique shown in FIG. 18. FIG. 19 shows a hydrogen path 116 to the silicon interface. The antireflection film 113 made of a silicon nitride film and the light-shielding film 107 made of a metal such as aluminum or tungsten blocks hydrogen. Hydrogen therefore needs to bypass the antireflection film 113 in order to reach the silicon interface. In other words, hydrogen needs to sequentially pass through the second insulating film 114 located on the antireflection film 113, and the first insulating film 112 located under the antireflection film 113.

Due to such a long hydrogen path to the silicon interface, hydrogen supply to the silicon interface is not enough to terminate dangling bonds on the silicon surface. As a result, the dangling bonds on the silicon interface cannot be sufficiently terminated.

If the dangling bonds are not sufficiently terminated, a plurality of intermediate energy levels are generated in an energy band of silicon. Electrons are excited from a valence band to a conduction band through the intermediate levels, although the probability is very low. Such electrons cause a dark current.

In order to sufficiently reduce a dark current, it is therefore necessary to supply a sufficient amount of hydrogen to the silicon interface to terminate dangling bonds.

In view of the above, a solid-state image sensor including an antireflection film and capable of supplying a sufficient amount of hydrogen to a silicon interface will be described below.

A solid-state image sensor of the present disclosure includes: a photoelectric conversion region formed in an upper part of a semiconductor substrate, for generating charges by photoelectric conversion; a transfer region formed in the upper part of the semiconductor substrate and located on a side of the photoelectric conversion region, for transferring the charges; and a transfer electrode formed over the semiconductor substrate and located above the transfer region. The solid-state image sensor further includes: a first insulating film which covers the photoelectric conversion region and the transfer electrode; an antireflection film which covers the first insulating film; and a first light-shielding film which is formed on the antireflection film and covers at least the transfer electrode. The antireflection film and the first light-shielding film have an opening above the transfer electrode.

In the above solid-state image sensor, the antireflection film is formed, and the opening is formed in the antireflection film and the first light-shielding film above the transfer electrode. Therefore, reflection losses on the photoelectric conversion region are suppressed, and a dark current can be reduced.

In other words, even if the antireflection film formed to suppress the reflection losses is a film that is less likely to be permeable to hydrogen, a hydrogen path is assured from the opening above the transfer electrode to the photoelectric conversion region through the first insulating film. A hydrogen sintering process can therefore be performed on the photoelectric conversion region.

As shown in FIG. 19, the structure of Document 3 also has the hydrogen path 116. The hydrogen path in Document 3, however, is a long path in which hydrogen passes through the second insulating film 114 located over the photoelectric conversion region 102, moves up to the opening 113a located above the transfer electrode 106, passes through the first insulating film 112 located under the light-shielding film 113, and finally reaches the photoelectric conversion region 102. In the present disclosure, on the other hand, hydrogen passes through the opening formed in the light-shielding film above the transfer electrode. The hydrogen path of the present disclosure is thus significantly shorter than that of Document 3. Accordingly, hydrogen can be more reliably supplied to the photoelectric conversion region to terminate dangling bonds. As a result, a dark current can be reduced.

Preferably, the solid-state image sensor further includes a second light-shielding film formed above the opening.

More preferably, the second light-shielding film has a size and a planar shape which are enough to cover the opening.

This can prevent light from entering the transfer electrode or the like through the opening. As a result, a smear component can be reduced.

Preferably, the solid-state image sensor further includes a contact for electrically connecting the transfer electrode and the second light-shielding film to each other.

In this case, the second light-shielding film can be used as shunt wirings for the transfer electrode, whereby a pulse delay can be suppressed.

Preferably, the first insulating film is formed integrally so as to extend over the photoelectric conversion region and the transfer region.

In this case, a seamless hydrogen path can be obtained in the first insulating film. As a result, dangling bonds are more reliably terminated, and a dark current can be more reliably reduced accordingly.

Preferably, the first light-shielding film is in contact with an upper surface of the antireflection film.

This implements reduction in false signals and improvement in sensitivity and also improves versatility of the solid-state image sensor, as described below.

When charges leak from a region between the upper surface of the photoelectric conversion region and the lower end of the first light-shielding film into the transfer region, a false signal called "smear" is generated. By forming the first light-shielding film directly on the antireflection film with no film interposed therebetween, this region can be narrowed, and leakage of charges is suppressed. As a result, smear can be reduced. In this case, the film thickness between the side surface of the transfer electrode and the first light-shielding film can also be reduced. Therefore, the opening above the photoelectric conversion region can be widened, whereby the sensitivity is improved.

In Document 3, a film needs to be formed between the reflection film and the first light-shielding film in order to obtain a hydrogen path. However, such a film need not necessarily be formed in the solid-state image sensor of the present disclosure. A thermal oxide film has conventionally been used as this film in view of the resistance to a driving voltage during operation. However, heat treatment for forming a thermal oxide film causes, for example, diffusion of an impurity profile in the semiconductor substrate, which has limited design versatility. Since no thermal oxide film need be formed in the manufacturing method of the solid-state image sensor of the present disclosure, the design versatility can be increased.

Preferably, the solid-state image sensor further includes a second insulating film between the first light-shielding film and the antireflection film.

This can relieve stress which is generated between the first light-shielding film and the antireflection film.

Preferably, the second insulating film is a silicon oxide film or a silicon oxynitride film.

The function to relieve the stress can be more reliably obtained by using a silicon oxide film or a silicon oxynitride film as the second insulating film.

Preferably, the first insulating film is a film which is permeable to hydrogen, and the antireflection film is a film which is not permeable to hydrogen.

The effect of using the first insulating film as a hydrogen path becomes significant in this case.

Preferably, the first insulating film is a silicon oxide film.

A silicon oxide film is a film which is permeable to hydrogen, and is therefore a desirable material to assure a hydrogen path.

Preferably, the antireflection film is a silicon nitride film.

A silicon nitride film, which is commonly used as an antireflection film, is a film which is not permeable to hydrogen. Accordingly, the effect of the technique of the present disclosure becomes significant when such an antireflection film is used.

Preferably, the solid-state image sensor further includes a hydrogen-containing silicon nitride film or a hydrogen-containing silicon oxynitride film over the first light-shielding film.

Since such a film serves as a hydrogen supply source, dangling bonds can be more reliably terminated, and a dark current can be more reliably reduced.

A method for manufacturing a solid-state image sensor according to the present disclosure includes the steps of: (a) forming a photoelectric conversion region and a transfer region in an upper part of a semiconductor substrate; (b) forming a transfer electrode over the semiconductor substrate at a position above the transfer region; (c) forming an insulating film which covers the photoelectric conversion region and the transfer region; (d) forming an antireflection film on the insulating film, where the antireflection film has a lower refractive index than that of the semiconductor substrate; (e) forming a first light-shielding film on the antireflection film; and (f) forming an opening in the antireflection film and the first light-shielding film at a position above the transfer electrode.

A solid-state image sensor having an antireflection film while suppressing a dark current can be manufactured according to the above manufacturing method of the solid-state image sensor. Even if the antireflection film and the first light-shielding film are not permeable to hydrogen, an opening is formed in the antireflection film and the first light-shielding film at a position above the transfer electrode, whereby a hydrogen path to the photoelectric conversion region is assured. Since there is such a hydrogen path, dangling bonds are terminated in the photoelectric conversion region by a hydrogen sintering process, whereby intermediate energy levels are eliminated. As a result, a dark current is reduced. The hydrogen path of the present disclosure is shorter than that of Document 3, and hydrogen therefore more reliably reaches the photoelectric conversion region.

Note that, in the step (e), the first light-shielding film is preferably formed in contact with the antireflection film.

In this case, the distance between an upper surface of the photoelectric conversion region and the first light-shielding film can be reduced. As a result, charges are prevented from leaking from this portion to the transfer region, whereby a false signal (smear) can be reduced. Moreover, the film thickness between the side surface of the transfer electrode and the first light-shielding film can also be reduced. Therefore, the opening above the photoelectric conversion region can be widened, whereby the sensitivity is improved. Moreover, the above method does not include the step of forming a thermal oxide film or the like between the antireflection film and the first light-shielding film. Accordingly, diffusion of an impurity profile within the semiconductor substrate, and the like can be prevented, whereby versatility of the solid-state image sensor can be improved.

Preferably, the above manufacturing method further includes the step of: after the step (f), forming a second light-shielding film above the opening.

Preferably, the second light-shielding film is formed with a size and a planar shape which are enough to cover the opening.

This can prevent light from entering the transfer electrode and the like through the opening.

Preferably, the first insulating film is formed by a silicon oxide film.

Since a silicon oxide film is permeable to hydrogen, the hydrogen path to the photoelectric conversion region can be more reliably ensured.

Preferably, the antireflection film is formed by a silicon nitride film.

Although a silicon nitride film is less likely to permeate to hydrogen, the manufacturing method of the solid-state image sensor of the present disclosure assures a hydrogen path, whereby a dark current can be more reliably reduced in a hydrogen sintering process.

Preferably, the above manufacturing method further includes the step of: after the step (f), forming a hydrogen-containing silicon nitride film or a hydrogen-containing silicon oxynitride film over the first light-shielding film.

Since such a film serves as a hydrogen supply source, dangling bonds can be more reliably terminated, and a dark current can be more reliably reduced.

As has been described above, the technique of the present disclosure provides a solid-state image sensor and a manufacturing method thereof, in which reflection losses are reduced by an antireflection film formed above a photoelectric conversion region, and a dark current is suppressed by reducing dangling bonds at the photoelectric conversion region by a hydrogen sintering process.

DETAILED DESCRIPTION

Hereinafter, embodiments of the technique of the present disclosure will be described with reference to the accompanying drawings. Each embodiment is shown as an example illustrating a structure, functions and effects, and a manufacturing method of a solid-state image sensor, and is not limited to the following details. Various modifications and changes can be made to the embodiments within the scope of the present invention.

First Embodiment

Figure 1:
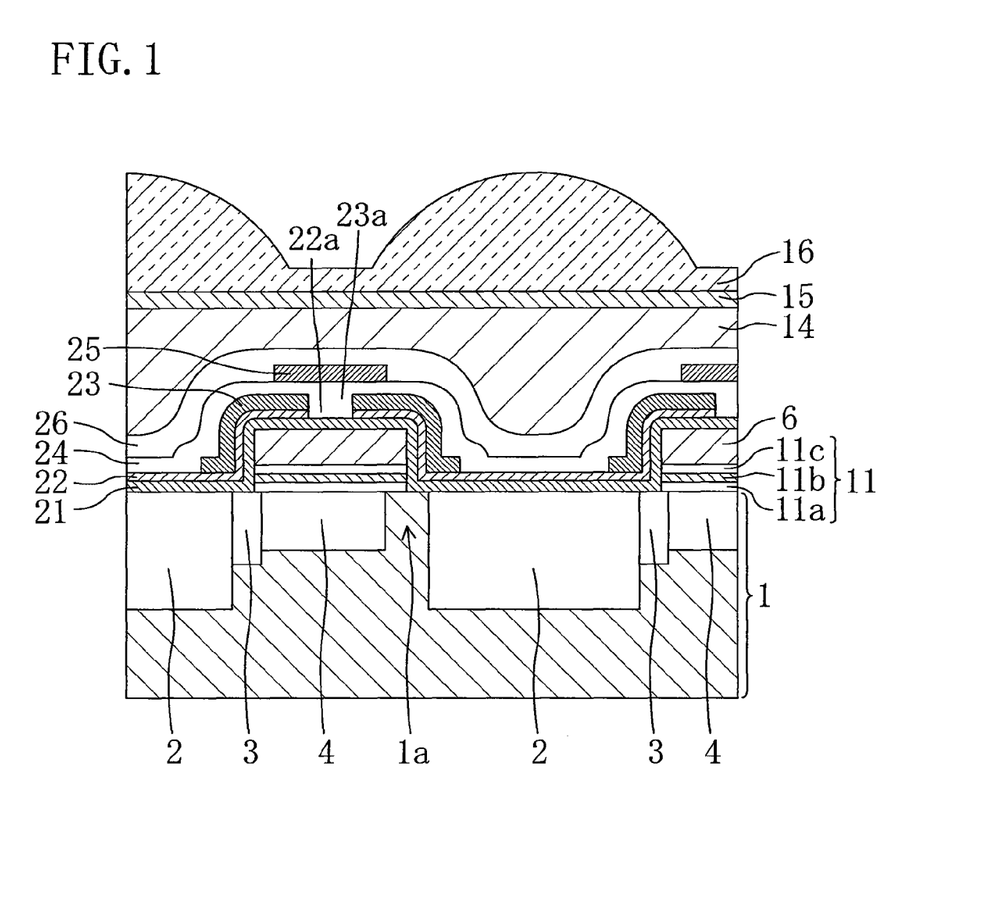
FIG. 1 shows a cross-sectional structure of a main part of an example solid-state image sensor according to a first embodiment of the present disclosure.

A first embodiment will now be described. FIG. 1 is a cross-sectional view of an example solid-state image sensor.

FIG. 1 shows especially a region including one of pixels arranged on a p-type silicon substrate 1.

As shown in FIG. 1, a plurality of photoelectric conversion regions 2 and a plurality of transfer regions 4 are alternately arranged in an upper part of the p-type silicon substrate (semiconductor substrate) 1. The photoelectric conversion regions 2 and the transfer regions 4 are n-type semiconductor regions. A p-type silicon layer of the p-type silicon substrate 1 remains between one end of each photoelectric conversion region 2 and one of adjacent transfer regions 4, and functions as a read region 1a for reading charges generated in the photoelectric conversion region 2 to the transfer region 4. An isolation region 3 is provided between the other end of each photoelectric conversion region 2 (the opposite end to the read region 1a) and the other transfer region 4 located at this end of the photoelectric conversion region 2. The isolation regions 3 are p+-type semiconductor regions. Each region located between two isolation regions 3, including one photoelectric conversion region 2 and one transfer region 4, functions as a pixel.

Transfer electrodes 6 are formed over the p-type silicon substrate 1. More specifically, the transfer electrodes 6 are respectively formed on the transfer regions 4 with an ONO insulating film 11 interposed therebetween. The ONO insulating film 11 is an insulating film having a so-called ONO structure. More specifically, a thin silicon oxide film 11a, a silicon nitride film 11b, and a silicon oxide film 11c are sequentially formed on the surface of each transfer region 4 in this order to form the ONO insulating film 11. The present disclosure is not limited to such an ONO film, but a single-layer film such as a silicon oxide film may be formed as an insulating film on each transfer region 4.

A first insulating film 21 is formed so as to continuously and integrally cover the photoelectric conversion regions 2 and the sidewalls and the upper surfaces of the transfer electrodes 6. The first insulating film 21 is a silicon oxide film.

An antireflection film 22 is formed on the insulating film 21 so as to cover the photoelectric conversion regions 2. The antireflection film 22 is made of a silicon nitride film having a refractive index higher than that of a silicon oxide film and lower than that of a silicon substrate. The antireflection film 22 has an opening 22a above each transfer electrode 6. The openings 22a are formed by removing a part of the antireflection film 22 above the upper surface of each transfer electrode 6.

Note that the silicon nitride film 11b under each transfer electrode 6 and the antireflection film 22 are isolated from each other by the first insulating film 21 formed therebetween. The silicon nitride film 11b and the antireflection film 22 are therefore not in contact with each other.

A first light-shielding film 23 made of tungsten or aluminum is formed on the antireflection film 22 above the transfer regions 4. The first light-shielding film 23 covers the sidewalls and the upper surface of each transfer electrode 6 to block light entering this region. The first light-shielding film 23 has an opening above each photoelectric conversion region 2. The first light-shielding film 23 thus exposes the antireflection film 22 above the photoelectric conversion regions 2 so as not to block light entering the photoelectric conversion regions 2. The first light-shielding film 23 further has an opening 23a above each transfer electrode 6. The openings 23a are formed integrally with the respective openings 22a of the antireflection film 22.

A first passivation film 24 is formed so as to cover the antireflection film 22 exposed above the photoelectric conversion regions 2, and the first light-shielding film 23. The first passivation film 24 fills the openings 22a and 23a above the transfer electrodes 6.

A second light-shielding film 25 is formed on the first passivation film 24 so as to cover the openings 22a and 23a. The second light-shielding film 25 above each transfer electrode 6 may have any area as long as it is large enough to prevent incident light on the solid-state image sensor from entering the opening 23a. It is desirable that the second light-shielding film 25 is larger than the opening area of the opening 23a and smaller than the area of the upper surface of the transfer electrode 6. A second passivation film 26 is formed on the second light-shielding film 25 and the first passivation film 24.

A first planarizing layer 14 is formed on the second passivation film 26, and a second planarizing layer 16 is formed on the first planarizing layer 14. The second planarizing layer 15 is preferably a silicon oxynitride film (SiON film) formed by a plasma CVD (Chemical Vapor Deposition) method. Lenses 16 are formed on the second planarizing layer 15 so as to correspond to the photoelectric conversion regions 2, respectively.

In the example solid-state image sensor having the above structure, dangling bonds near the upper surfaces of the photoelectric conversion regions 2 are effectively terminated by performing a sintering process in a hydrogen atmosphere, whereby a dark current can be reduced. This will now be described.

Figure 2:
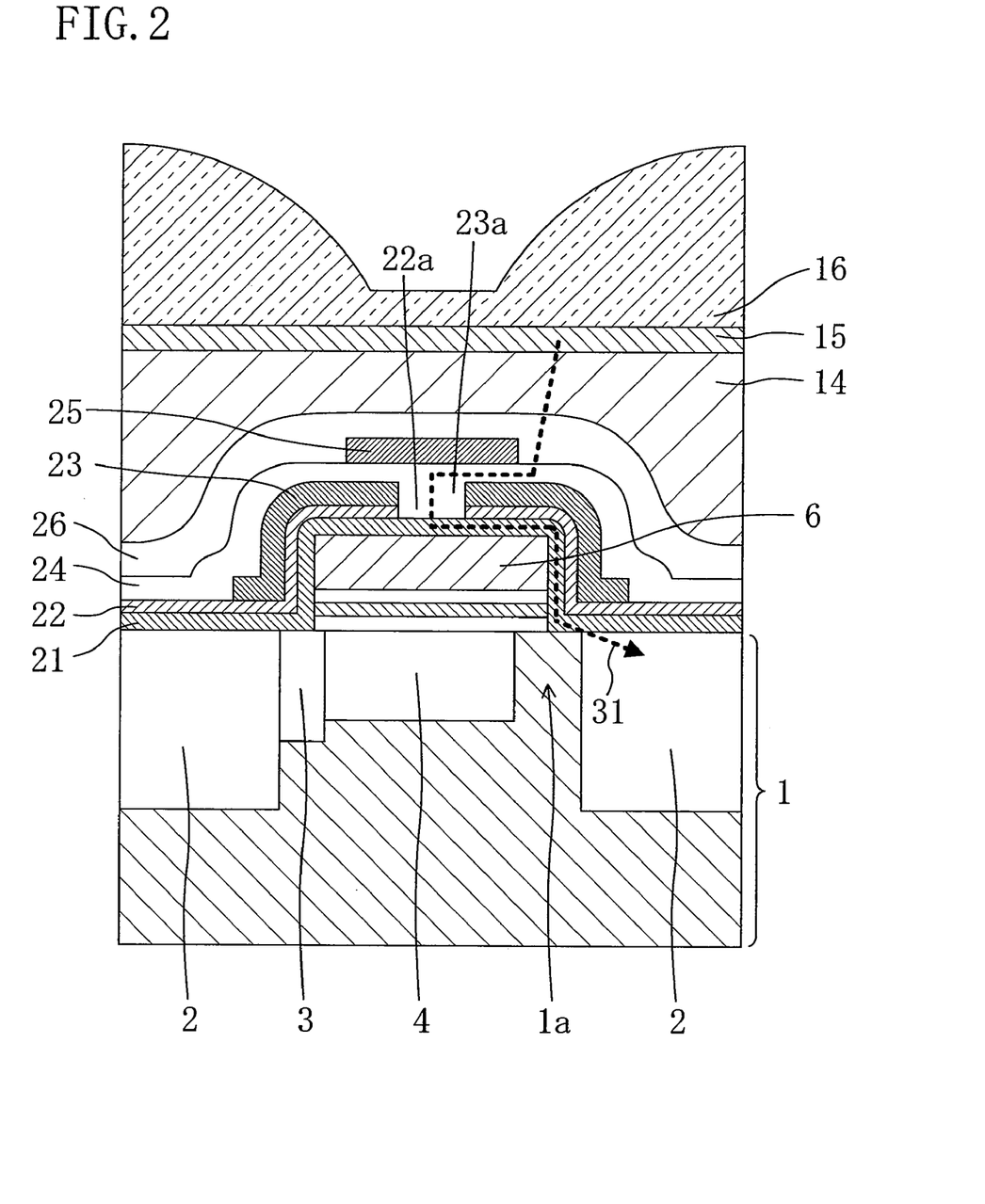
FIG. 2 shows a hydrogen path to a photoelectric conversion region in a hydrogen sintering process in the example solid-state image sensor of FIG. 1.

FIG. 2 shows a hydrogen path in a sintering process which is performed in a hydrogen atmosphere in a manufacturing process of the solid-state image sensor. The manufacturing process of the solid-state image sensor will be described later in detail.

The second planarizing layer 15, which is a SiON film formed by a plasma CVD method, has a high hydrogen content. The second planarizing layer 15 therefore discharges hydrogen at a sintering temperature of, for example, 350° C. to 450° C. The first planarizing layer 14, the first passivation film 24, the second passivation film 26, and the first insulating film 21 are hydrogen permeable films such as a silicon oxide film. On the other hand, hydrogen is less likely to permeate the first light-shielding film 23 and the second light-shielding film 25 (which are made of tungsten or aluminum) and the antireflection film 22 (which is a silicon nitride film). However, since the antireflection film 22 and the first light-shielding film 23 have the openings 22a and 23a above each transfer region 4, hydrogen discharged from the second planarizing layer 15 can reach the silicon interface on each photoelectric region 2 through the openings 22a and 23a and the first insulating film 21 along a path 31. Dangling bonds at the interface between each photoelectric conversion region 2 (silicon layer) and the first insulating film 21 (silicon oxide layer) are therefore terminated by hydrogen, and intermediate energy levels are suppressed. As a result, a dark current can be significantly reduced.

Although the structure of Document 3 shown in FIG. 19 also has a hydrogen path, the hydrogen path of the present embodiment is shorter than that of Document 3. The structure of the present embodiment therefore enables hydrogen to more easily reach the silicon interface to terminate dangling bonds. As a result, a dark current can be more reliably reduced.

Moreover, the example solid-state image sensor has the antireflection film 22 and therefore has improved sensitivity. In general, about 30% of incident light (visible light) is reflected at the interface between a silicon substrate and a silicon oxide film, and this reflection contributes to reduction in sensitivity. Such a high reflectance at the interface between a silicon substrate and a silicon oxide film is due to a large difference in refractive index between silicon (about 3 to about 4) and the silicon oxide film (about 1.45).

In view of the above, an antireflection film having a refractive index higher than that of a silicon oxide film and lower than a silicon substrate is formed in the present embodiment. This enables light to be incident on silicon at a higher ratio, whereby the sensitivity is improved.

Hereinafter, a manufacturing method of the example solid-state image sensor will be described. FIGS. 3 through 11 are cross-sectional views illustrating the manufacturing process.

Figure 3:
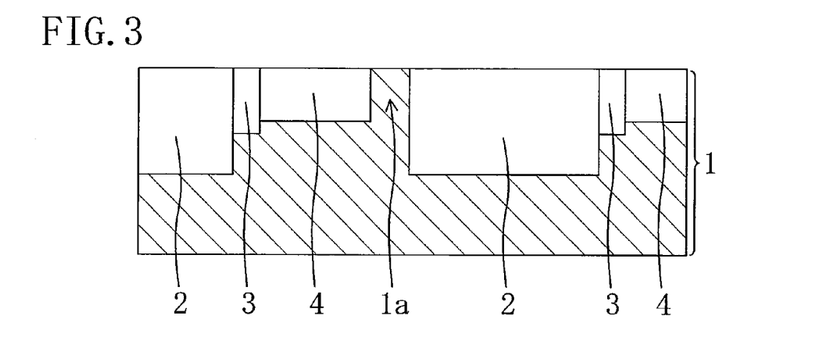
FIG. 3 is a diagram illustrating a manufacturing method of the example solid-state image sensor of the first embodiment.

First, as shown in FIG. 3, photoelectric conversion regions 2, transfer regions 4, and isolation regions 3 are formed in an upper part of a p-type silicon substrate 1. The photoelectric conversion regions 2 and the transfer regions 4 are n-type semiconductor regions, and the isolation regions 3 are $p^+$-type semiconductor regions. Each region including one photoelectric conversion region 2 and one transfer region 4 forms a pixel, and the isolation regions 3 isolate the pixels from each other. In each pixel, a p-type silicon layer of the p-type silicon substrate 1 is present between the photoelectric conversion region 2 and the transfer region 4 as a read region 1a. The photoelectric conversion regions 2, the isolation regions 3, and the transfer regions 4 are formed by, for example, impurity implantation.

Figure 4:
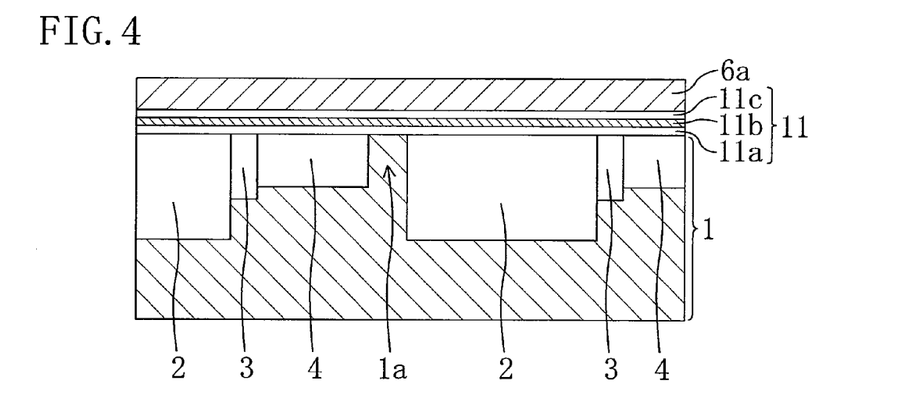
FIG. 4 is a diagram illustrating the manufacturing method of the example solid-state image sensor after FIG. 3.

Next, the step of FIG. 4 is performed. First, an ONO insulating film 11 is formed over the p-type silicon substrate 1 so as to cover the photoelectric conversion regions 2, the isolation regions 3, the transfer regions 4, and the read regions 1a. The ONO insulating film 11 is formed as follows: a silicon oxide film 11a is first formed. The silicon oxide film 11a is preferably formed by growing a silicon oxide film by an LPCVD (Low Pressure Chemical Vapor Deposition) method and heat-treating the silicon oxide film at a temperature higher than the growth temperature of the LPCVD method. A silicon nitride film 11b is then formed on the silicon oxide film 11a. The silicon nitride film 11b is preferably formed by a plasma CVD method. A silicon oxide film 11c is then formed on the silicon nitride film 11b. The silicon oxide film 11c is grown by, for example, an LPCVD method. The ONO insulating film 11 having a layered structure of the silicon oxide film/the silicon nitride film/the silicon oxide film (a so-called ONO structure) is thus formed over the p-type silicon substrate 1.

Note that the ONO insulating film 11 is positioned under transfer electrodes 6 which are formed in a later step, but is not necessarily a film having an ONO structure. For example, the silicon nitride film 11b and the silicon oxide film 11c may be omitted. In other words, the insulating film 11 may be a single-layer insulating film of the silicon oxide film 11c.

A polysilicon layer 6a for forming the transfer electrodes 6 is then formed on the ONO insulating film 11.

Figure 5:
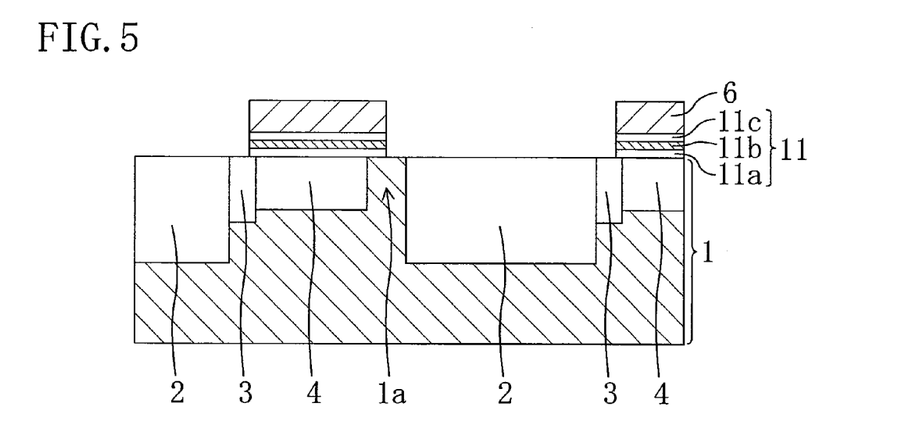
FIG. 5 is a diagram illustrating the manufacturing method of the example solid-state image sensor after FIG. 4.

As shown in FIG. 5, the polysilicon layer 6a and the ONO insulating film 11 are removed above the photoelectric conversion regions 2 by resist formation, etching, and the like. Transfer electrodes 6 are thus respectively patterned on the transfer regions 4 with the ONO insulating film 11 interposed therebetween. The upper surfaces of the photoelectric conversion regions 2 are exposed in this process.

Figure 6:
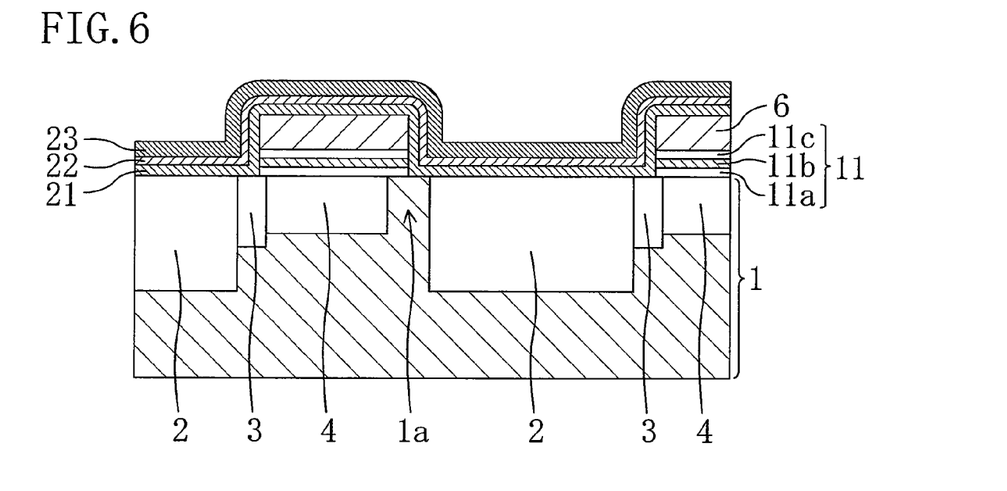
FIG. 6 is a diagram illustrating the manufacturing method of the example solid-state image sensor after FIG. 5.

Next, the step of FIG. 6 is performed. First, a first insulating film 21 is formed so as to continuously cover the photoelectric conversion regions 2 and the transfer electrodes 6. The first insulating film 21 is a silicon oxide film. The first insulating film 21 is preferably grown by an LPCVD method providing uniform step coverage and capable of precisely controlling a film thickness.

An antireflection film 22 is then formed so as to cover the first insulating film 21. The antireflection film 22 is a silicon nitride film. The antireflection film 22 is preferably formed with a thickness of about 50 nm in order to improve sensitivity in a visible light region.

A first light-shielding film 23 is then formed so as to cover the antireflection film 22. The first light-shielding film 23 is formed by, for example, a CVD method by using aluminum or tungsten.

Figure 7:
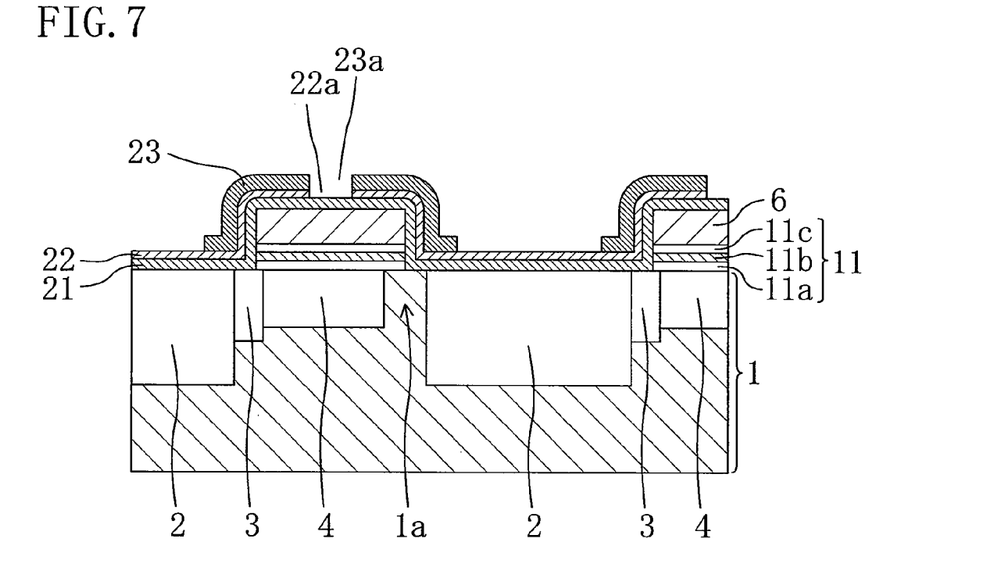
FIG. 7 is a diagram illustrating the manufacturing method of the example solid-state image sensor after FIG. 6.

Next, the step of FIG. 7 is performed. First, the first light-shielding film 23 above the photoelectric conversion regions 2 and the transfer electrodes 6 is partially removed by etching or the like. Since the antireflection film 22 serves as an etching stopper layer, etching can be easily performed without leaving a residue of the first light-shielding film 23 on the antireflection film 22. The first light-shielding film 23 thus formed exposes the antireflection film 22 above the photoelectric conversion regions 2, and has an opening 23a above each transfer electrode 6.

Openings 22a are then formed in the antireflection film 22 by etching or the like. The openings 22a are formed integrally with the respective openings 23a above the transfer electrodes 6. In this process, the antireflection film 22 exposed above the photoelectric conversion regions 3 is covered with, for example, a resist so that the antireflection film 22 is not etched above the photoelectric conversion regions 3.

Figure 8:
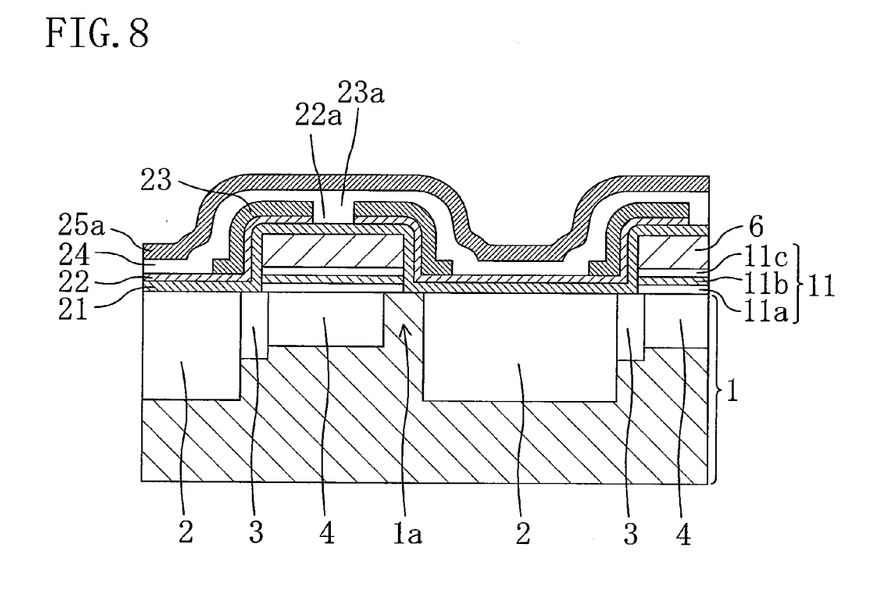
FIG. 8 is a diagram illustrating the manufacturing method of the example solid-state image sensor after FIG. 7.

Next, the step of FIG. 8 is performed. First, a first passivation film 24 is formed. The first passivation film 24 is formed so as to cover the first light-shielding film 23 and the antireflection film 22 exposed above the photoelectric conversion regions 2 and to fill the openings 22a and 23a. Due to the difference in level between the transfer region 6 and the photoelectric conversion region 2, the first passivation film 24 is recessed toward the p-type silicon substrate 1 above each photoelectric conversion region 2.

A light-shielding material film 25a for forming a second light-shielding film 25 is then formed on the first passivation film 24. The light-shielding material film 25a is made of, for example, aluminum or tungsten.

Figure 9:
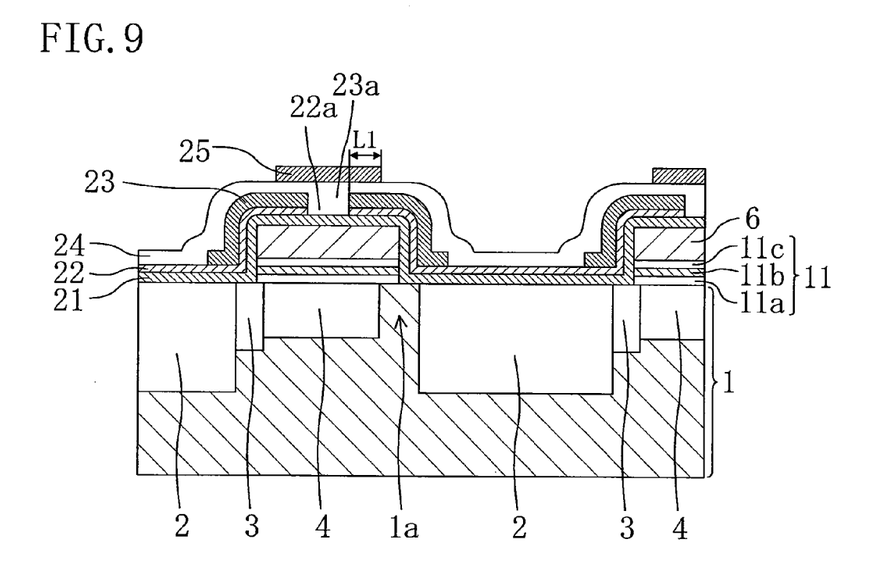
FIG. 9 is a diagram illustrating the manufacturing method of the example solid-state image sensor after FIG. 8.

As shown in FIG. 9, the light-shielding material film 25a is then etched to pattern the second light-shielding film 25 which covers the openings 23a. The second light-shielding film 25 above each transfer electrode 6 has a larger area than that of the opening 23a. The second light-shielding film 25 can thus prevent incident light on the solid-state image sensor from entering the openings 23a. The distance L1 from the end of the opening 23a to the end of the second light-shielding film 25 (the overlap distance between the first light-shielding film 23 and the second light-shielding film 25) is preferably larger than the thickness of the first passivation film 24 in this region. As a result, obliquely incident light can also be prevented from entering the openings 23a.

Since the second light-shielding film 25 is formed over the openings 22a and 23a, incident light can be prevented from entering the transfer electrodes 6 and the transfer regions 4, whereby a smear component can be suppressed.

Figure 10:
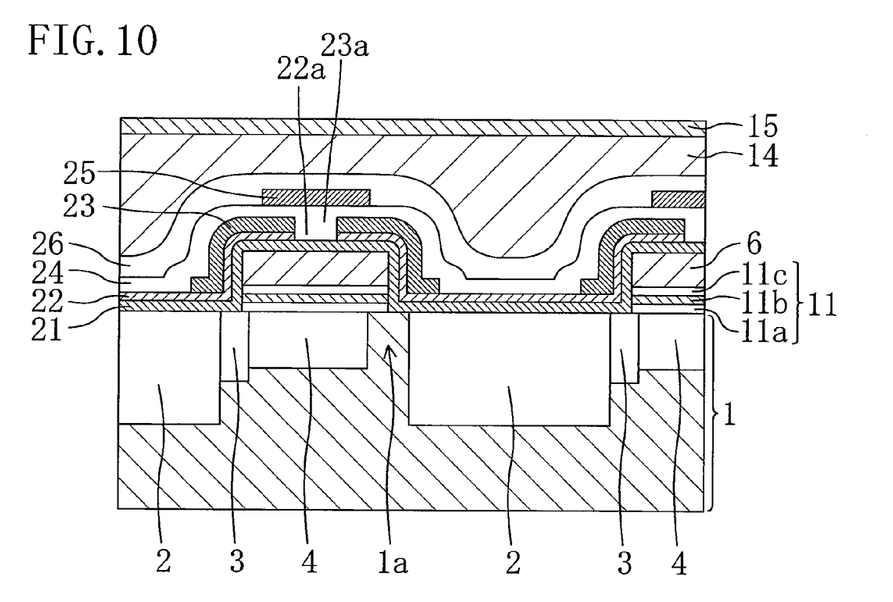
FIG. 10 is a diagram illustrating the manufacturing method of the example solid-state image sensor after FIG. 9.

The step of FIG. 10 is then performed. First, a second passivation film 26 is formed so as to cover the first passivation film 24 and the second light-shielding film 25. Like the first passivation film 24, the second passivation film 26 is also recessed toward the p-type silicon substrate 1 above each photoelectric conversion region 2 due to the difference in level between the transfer region 6 and the photoelectric conversion region 2.

Note that the first passivation film 24 and the second passivation film 26 are desirably made of, for example, an impurity-free silicon oxide film, that is, so-called NSG (Non-doped Silicate Glass).

A first planarizing layer 14 is then formed on the second passivation film 26. The first planarizing layer 14 is preferably a film having a higher refractive index than that of the second passivation film 26. Since the second passivation film 26 is recessed above each photoelectric conversion region 2, the first planarizing layer 14 can provide a convex lens effect (downwardly curved convex lens). In other words, incident light can be focused to a position close to the p-type silicon substrate 1, whereby the amount of light entering the photoelectric conversion regions 2 can be increased and the sensitivity can be improved. Moreover, light leakage to the transfer regions 4 is reduced, whereby smear can be suppressed.

A second planarizing layer 15 is then formed on the first planarizing layer 14. The second planarizing layer 15 is preferably made of a plasma oxynitride film or a plasma oxide film. A plasma oxynitride film and a plasma oxide film have a high hydrogen content. Therefore, when a sintering process is performed at about 350° C. to about 380° C. after formation of the second planarizing layer 15, hydrogen is discharged from the second planarizing layer 15, and the hydrogen thus discharged reaches the photoelectric conversion regions 2 through the path 31 shown in FIG. 2. The hydrogen terminates dangling bonds near a silicon interface (the interface between each photoelectric conversion region 2 and the first insulating film 21 thereon), and intermediate energy levels are reduced. As a result, a dark current can be suppressed.

Figure 11:
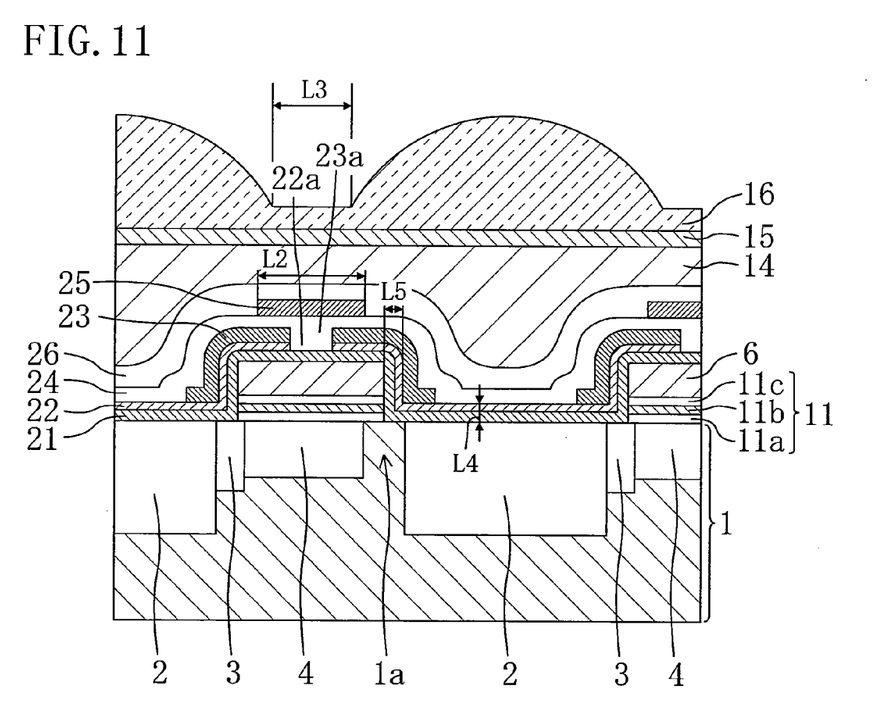
FIG. 11 is a diagram illustrating the manufacturing method of the example solid-state image sensor after FIG. 10.

The step of FIG. 11 is then performed. Lenses 16 are formed on the second planarizing layer 15 so at to correspond to the photoelectric conversion regions 2, respectively. The lenses 16 enable incident light on the solid-state image sensor to efficiently enter the photoelectric conversion regions 2. Note that the lenses 16 can be formed by existing semiconductor processes. For example, after a silicon nitride film is formed over the whole substrate surface, a resist pattern is formed on the silicon nitride film, and the silicon nitride film is dry-etched to form lenses. A planarizing layer, a color filter, microlenses, and the like may be formed over the lenses 16 in order to obtain color separation and a high focusing effect.

The width L2 of the second light-shielding film 25 is preferably larger than the width L3 of each flat part between the lenses 16. In this case, light incident on the flat parts can also be prevented from entering the transfer regions 4 through the openings 23a. Note that light incident on the convex parts of the lenses 16 is focused toward the photoelectric conversion regions 2.

In the solid-state image sensor of the present embodiment, the first light-shielding film 23 is formed directly on the antireflection film 22 with no film interposed therebetween. In other words, the first light-shielding film 23 is in contact with the antireflection film 22. This is different from the structure of FIG. 18 in which an insulating film is interposed between the light-shielding film and the antireflection film.

Since no insulating film is formed between the first light-shielding film 23 and the antireflection film 22, the number of steps in the manufacturing process is reduced, thereby enabling cost reduction. Moreover, a thermal oxide film is commonly used as such an insulating film, and the impurity profile in a silicon substrate is conventionally sometimes diffused by heat treatment for forming the thermal oxide film. The solid-state image sensor of the present embodiment can avoid such diffusion of the impurity profile, and the design flexibility of the solid-state image sensor is increased. As a result, versatility of the solid-state image sensor is improved.

Since the first light-shielding film 23 is in contact with the antireflection film 22, the thickness L4 between the upper surface of the photoelectric conversion region 2 and the first light-shielding film 23 is smaller than that in the structure in which an insulating film is interposed between the light-shielding film and the antireflection film. Therefore, charges are prevented from leaking through this portion to the transfer regions 4, whereby a false signal (smear) can be reduced.

The thickness L5 between the side surface of the transfer electrode 6 and the first light-shielding film 23 in the lateral direction (the direction in parallel with the principal surface of the p-type silicon substrate 1) is also reduced by the amount corresponding to the thickness of the insulating film or the like. Accordingly, the overlap amount of the first light-shielding film 23 with each photoelectric conversion region 2 can be reduced, whereby the opening above each photoelectric conversion region 2 can be widened. As a result, sensitivity can be improved.

(Modification)

Figure 12:
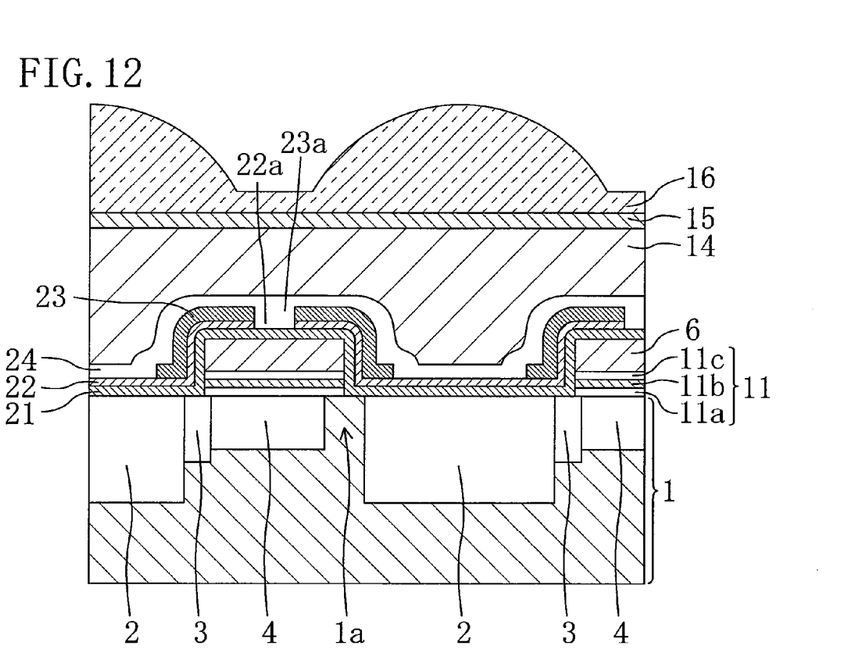
FIG. 12 shows a cross-sectional structure of a main part of an example solid-state image sensor according to a modification of the first embodiment.

Hereinafter, a modification of the first embodiment will be described. FIG. 12 is a cross-sectional view of a solid-state image sensor of the modification.

The solid-state image sensor of FIG. 12 is different from that of FIG. 1 in that the solid-state image sensor of FIG. 12 does not include the second light-shielding film 25 and the second passivation film 26.

In this case as well, the antireflection film 22 formed over the photoelectric conversion regions 2 reduces reflection losses, and the openings 22a and 23a formed above the transfer electrodes 6 ensure a hydrogen path. The modification also has the effects of improving sensitivity and reducing a dark current.

Since the solid-state image sensor of the modification does not have the second light-shielding film 26, there may be light leakage from the openings 22a and 23a to the transfer regions 4. By, for example, appropriately setting the structure of the lenses 16, however, it is possible to reduce the amount of light entering a region near the transfer electrodes 6. Therefore, incident light from the openings does not necessarily be a problem.

Second Embodiment

Figure 13:
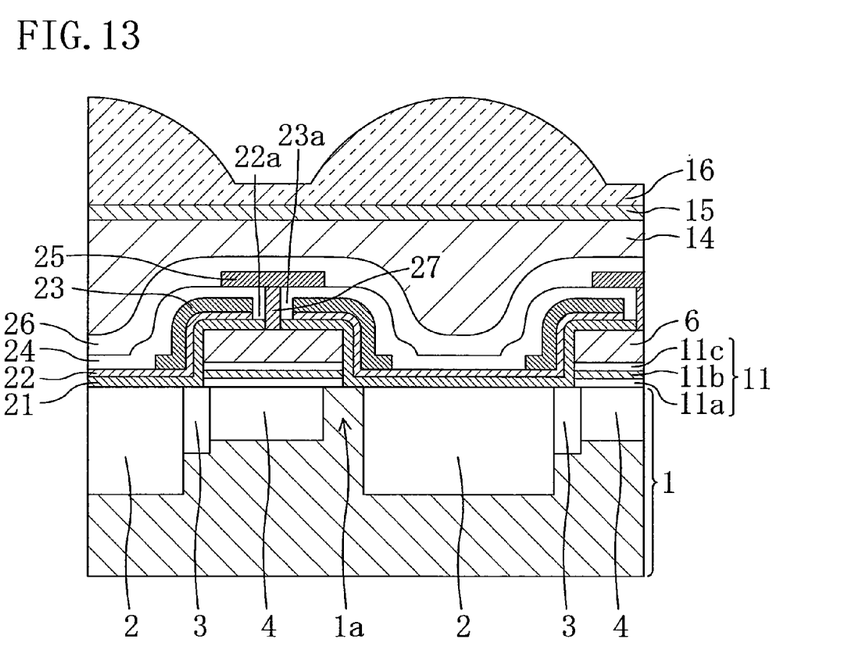
FIG. 13 shows a cross-sectional structure of a main part of an example solid-state image sensor according to a second embodiment of the present disclosure.

Hereinafter, an example solid-state image sensor of a second embodiment will be described. FIG. 13 is a cross-sectional view showing a main part of the solid-state image sensor of the second embodiment.

The solid-state image sensor of FIG. 13 is different from that of the first embodiment of FIG. 1 in that contacts 27 are further formed between the second light-shielding film 25 and the transfer electrodes 6 in order to connect the second light-shielding film 25 to the transfer electrodes 6. The contacts 27 are located in the openings 22a and 23a. The solid-state image sensor of the second embodiment is otherwise the same as that of the first embodiment. In FIG. 13, the same components as those of the first embodiment are denoted with the same reference numerals and characters as those of FIG. 1, and detailed description thereof will be omitted. The effects described in the first embodiment are obtained also by the solid-state image sensor of the second embodiment.

Like the first light-shielding film 23 and the second light-shielding film 25, the contacts 27 are made of, for example, aluminum or tungsten. The second light-shielding film 25 is thus electrically connected to the transfer electrodes 6 by the contacts 27.

Figure 14:
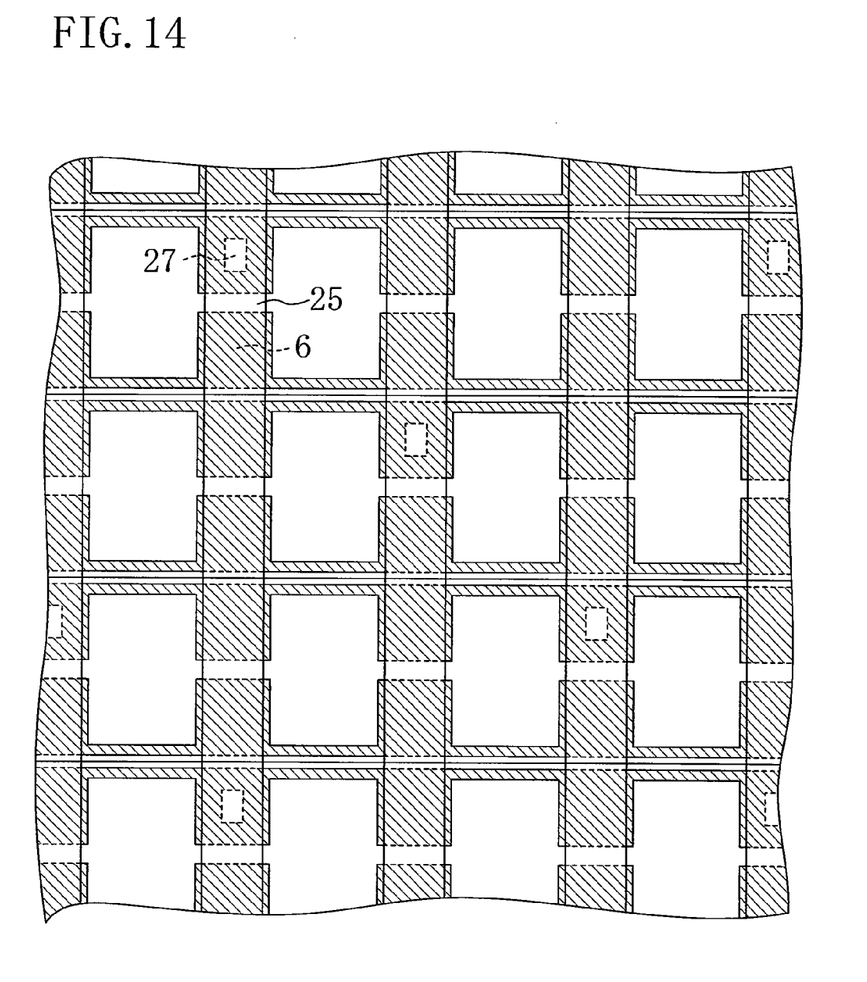
FIG. 14 is a diagram showing a planar structure, especially contact arrangement, of the example solid-state image sensor of the second embodiment.

FIG. 14 shows two-dimensional arrangement of the contacts 27. FIG. 14 shows only some of the components of the solid-state image sensor formed above the p-type silicon substrate 1, such as the transfer electrodes 6, the contacts 27, and the second light-shielding film 25, and other components are not shown in FIG. 14.

The second light-shielding film 25 made of aluminum or tungsten extends over the transfer regions 4 and the transfer electrodes 6 in a plurality of pixels arranged in a matrix pattern. The second light-shielding film 25 is thus connected to the transfer electrodes 6 through the contacts 27 and functions as shunt wirings of the solid-state image sensor. In other words, a pulse delay tends to be generated in the polysilicon transfer electrode 6. However, such a pulse delay can be suppressed by providing the shunt wirings by the contacts 27 and the second light-shielding film 25 which are made of a metal.

Note that the contacts 27 can be formed by merely adding the step of forming holes for the contacts 27 to the manufacturing process of the solid-state image sensor of the first embodiment. In other words, the step of forming the contact holes so as to expose the upper surfaces of the transfer electrodes 6 is added after formation of the first passivation film 24. The contact holes are formed by removing a part of the first insulating film 21 and a part of the first passivation film 24 above the transfer electrodes 6 by etching or the like. The light-shielding material film 25a for forming the second light-shielding film 25 is formed after the step of forming the contact holes. In the step of forming the light-shielding material film 25a, the contact holes are simultaneously filled with the same material as the light-shielding material film 25a, whereby the contacts 27 can be formed.

Third Embodiment

Figure 15:
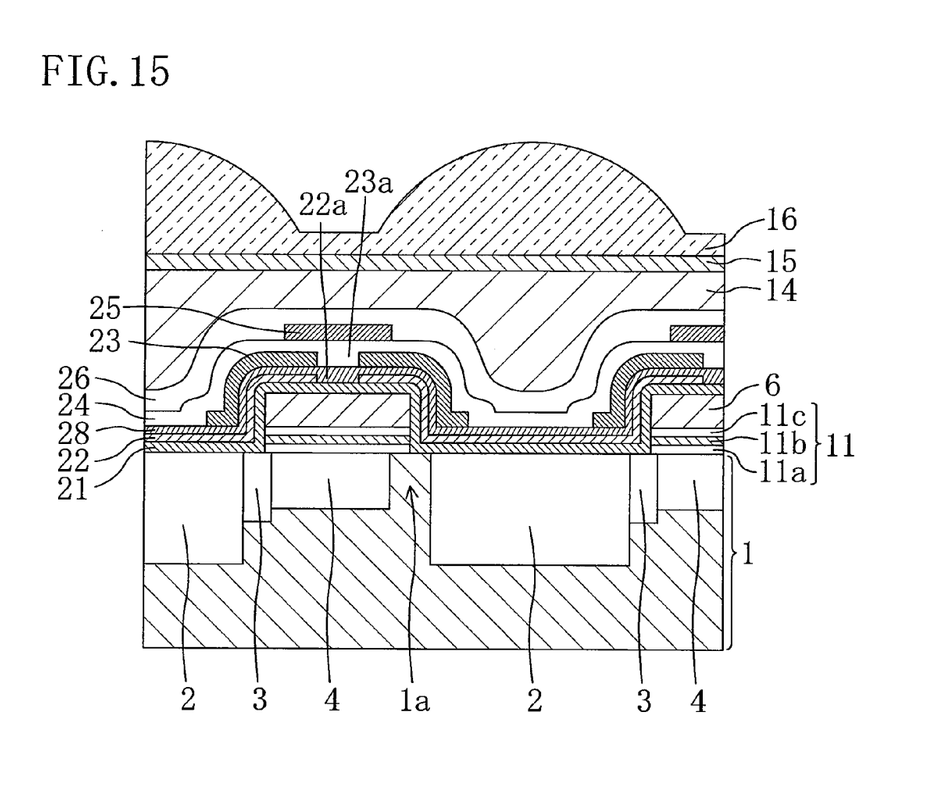
FIG. 15 shows a cross-sectional structure of a main part of an example solid-state image sensor according to a third embodiment of the present disclosure.

Hereinafter, an example solid-state image sensor of a third embodiment will be described. FIG. 15 is a cross-sectional view showing a main part of the solid-state image sensor of the third embodiment.

The solid-state image sensor of FIG. 15 is different from that of the first embodiment of FIG. 1 in that a second insulating film 28 is further formed on the antireflection film 22 and under the first light-shielding film 23 and the first passivation film 24. The openings 22a of the antireflection film 22 formed above the transfer electrodes 6 are filled with the second insulating film 28, and the openings 23a of the first light-shielding film 23 formed on the second insulating film 28 are filled with the first passivation film 24. The solid-state image sensor of the third embodiment is otherwise the same as that of the first embodiment. In FIG. 15, the same components as those of FIG. 1 are denoted with the same reference numerals and characters, and detailed description thereof will be omitted.

The second insulating film 28 is, for example, a silicon oxide film. In the solid-state image sensor of the present embodiment, the antireflection film 22 and the first light-shielding film 23 are silicon nitride films. Accordingly, large stress tends to be generated between the antireflection film 22 and the first light-shielding film 23 when the antireflection film 22 and the first light-shielding film 23 are in contact with each other as in the first embodiment of FIG. 1. The first light-shielding film 23 tends to be peeled off under such stress.

The stress in this region can be relieved by forming the second insulating film 28 (a silicon oxide film) between the antireflection film 22 and the first light-shielding film 23. In other words, the second insulating film 28 functions as a buffer film for stress relief.

The second insulating film 28 is formed as follows: the antireflection film 22 made of a silicon nitride film is formed as in the manufacturing process of the solid-state image sensor of the first embodiment. Thereafter, openings 22a are formed by removing a part of the antireflection film 22 above the transfer electrodes 6 by etching. The second insulating film 28 made of a silicon oxide film is then formed by, for example, a CVD method. The second insulating film 28 is formed so as to cover the antireflection film 22 and to fill the openings 22a.

Thereafter, the first light-shielding film 23 is formed on the second insulating film 28. Openings 23a are then formed in the first light-shielding film 23 above the transfer electrodes 6, and the first passivation film 24, the second light-shielding film 25, and the like are sequentially formed over the substrate surface. These steps are the same as those of the first embodiment.

The second insulating film 28 may alternatively be formed by thermally oxidizing the antireflection film 22 made of a silicon nitride film. More specifically, the antireflection film 22 may be thermally oxidized to form a thin silicon oxide film which covers the antireflection film 22, and this thin silicon oxide film may be used as the second insulating film 28. In the technique of FIG. 1, the portion corresponding to the second insulating film 28 is a hydrogen path and therefore needs to have a certain thickness. In the solid-state image sensor of the present embodiment, however, the second insulating film 28 is provided for stress relief and does not need to be a hydrogen path. The second insulating film 28 therefore can have a small thickness. A silicon oxide film can be formed with a smaller thickness by thermal oxidation than by a CVD method. As described in the first embodiment with reference to FIG. 11, in order to reduce smear and to improve sensitivity, it is preferable to reduce the dimensions corresponding to L4 and L5 by reducing the thickness of the second insulating film 28.

What is claimed is:

1. A solid-state image sensor, comprising:
   a photoelectric conversion region formed in an upper part of a semiconductor substrate, for generating charges by photoelectric conversion;
   a transfer region formed in the upper part of the semiconductor substrate and located on a side of the photoelectric conversion region, for transferring the charges;
   a transfer electrode formed over the semiconductor substrate and located above the transfer region;
   a first insulating film which covers the photoelectric conversion region and the transfer electrode;
   an antireflection film which covers the first insulating film; and
   a first light-shielding film which is formed on the antireflection film and covers at least the transfer electrode, wherein
   the antireflection film and the first light-shielding film have an opening above the transfer electrode.

2. The solid-state image sensor of claim 1, further comprising a second light-shielding film formed above the opening.

3. The solid-state image sensor of claim 2, wherein the second light-shielding film has a size and a planar shape which are enough to cover the opening.

4. The solid-state image sensor of claim 2, further comprising a contact for electrically connecting the transfer electrode and the second light-shielding film to each other.

5. The solid-state image sensor of claim 2, wherein the first insulating film is formed integrally so as to extend over the photoelectric conversion region and the transfer region.

6. The solid-state image sensor of claim 2, wherein the first light-shielding film is in contact with an upper surface of the antireflection film.

7. The solid-state image sensor of claim 1, further comprising a second insulating film between the first light-shielding film and the antireflection film.

8. The solid-state image sensor of claim 7, wherein the second insulating film is a silicon oxide film or a silicon oxynitride film.

9. The solid-state image sensor of claim 2, wherein
   the first insulating film is a film which is permeable to hydrogen, and
   the antireflection film is a film which is not permeable to hydrogen.

10. The solid-state image sensor of claim 2, wherein the first insulating film is a silicon oxide film.

11. The solid-state image sensor of claim 2, wherein the antireflection film is a silicon nitride film.

12. The solid-state image sensor of claim 2, further comprising a hydrogen-containing silicon nitride film or a hydrogen-containing silicon oxynitride film over the first light-shielding film.

13. The solid-state image sensor of claim 1, wherein the first insulating film is formed integrally so as to extend over the photoelectric conversion region and the transfer region.

14. The solid-state image sensor of claim 1, wherein the first light-shielding film is in contact with an upper surface of the antireflection film.

15. The solid-state image sensor of claim 1, wherein the first insulating film is a film which is permeable to hydrogen, and the antireflection film is a film which is not permeable to hydrogen.

16. The solid-state image sensor of claim 1, wherein the first insulating film is a silicon oxide film.

17. The solid-state image sensor of claim 1, wherein the antireflection film is a silicon nitride film.

18. The solid-state image sensor of claim 1, further comprising a hydrogen-containing silicon nitride film or a hydrogen-containing silicon oxynitride film over the first light-shielding film.

* * * * *